United States Patent
Yu et al.

(10) Patent No.: US 11,342,475 B2
(45) Date of Patent: May 24, 2022

(54) SCHOTTKY PHOTODETECTOR

(71) Applicant: ROCKLEY PHOTONICS LIMITED, London (GB)

(72) Inventors: Guomin Yu, Glendora, CA (US); Hooman Abediasl, Pasadena, CA (US); Aaron John Zilkie, Pasadena, CA (US)

(73) Assignee: Rockley Photonics Limited, Oxford (GB)

( * ) Notice: Subject to any disclaimer, the term of this patent is extended or adjusted under 35 U.S.C. 154(b) by 21 days.

(21) Appl. No.: 16/641,142

(22) PCT Filed: Aug. 20, 2018

(86) PCT No.: PCT/IB2018/001068
§ 371 (c)(1),
(2) Date: Feb. 21, 2020

(87) PCT Pub. No.: WO2019/038598
PCT Pub. Date: Feb. 28, 2019

(65) Prior Publication Data
US 2020/0176627 A1    Jun. 4, 2020

Related U.S. Application Data

(60) Provisional application No. 62/548,751, filed on Aug. 22, 2017.

(51) Int. Cl.
*H01L 31/108*    (2006.01)
*H01L 31/0224*    (2006.01)
(Continued)

(52) U.S. Cl.
CPC ...... *H01L 31/108* (2013.01); *H01L 31/02327* (2013.01); *H01L 31/022408* (2013.01); *H01L 31/1804* (2013.01); *H01L 31/1864* (2013.01)

(58) Field of Classification Search
CPC .......... H01L 31/108; H01L 31/022408; H01L 31/02327; H01L 31/1804; H01L 31/1864; H01L 27/288
See application file for complete search history.

(56) References Cited

U.S. PATENT DOCUMENTS

| 7,026,701 B2 | 4/2006 | Scales et al. |
| 2002/0079427 A1 | 6/2002 | Xu et al. |
| (Continued) | | |

FOREIGN PATENT DOCUMENTS

| CN | 103809303 A | 5/2014 |
| CN | 102569485 B | 12/2014 |

OTHER PUBLICATIONS

Dainesi, P. et al., "Scaling SOI photonics to micron and sub-micron devices", Opto-Ireland 2005: Nanotechnology and Nanophotonics, 2005, pp. 13-22, vol. 5824, Proc of SPIE, Bellingham, WA.
(Continued)

*Primary Examiner* — Shaun M Campbell
(74) *Attorney, Agent, or Firm* — Lewis Roca Rothgerber Christie LLP

(57) ABSTRACT

An optoelectronic device, and a method of fabricating an optoelectronic device. The device comprising: a rib waveguide formed of doped silicon, said doped waveguide having a ridge portion, containing an uppermost surface and two sidewall surfaces; and a slab portion, adjacent to the two sidewall surfaces. The device further comprises: a metal contact layer, which directly abuts the uppermost surface and two sidewall surfaces, and which extends along a part of the slab portion so as to provide a Schottky barrier between the metal contact layer and the rib waveguide.

24 Claims, 9 Drawing Sheets

(51) Int. Cl.
*H01L 31/0232* (2014.01)
*H01L 31/18* (2006.01)

(56) References Cited

U.S. PATENT DOCUMENTS

| | | | | |
|---|---|---|---|---|
| 2005/0265679 A1* | 12/2005 | Liu | ............... | G02B 6/122 |
| | | | | 385/131 |
| 2006/0039666 A1* | 2/2006 | Knights | ........ | H01L 31/035281 |
| | | | | 385/129 |
| 2012/0063717 A1* | 3/2012 | Grenouillet | ............ | G02B 6/136 |
| | | | | 385/14 |
| 2013/0064491 A1* | 3/2013 | Fujikata | .............. | G02F 1/025 |
| | | | | 385/2 |
| 2014/0008659 A1* | 1/2014 | Wong | ............... | H01L 29/1066 |
| | | | | 257/76 |
| 2015/0086153 A1* | 3/2015 | Ono | ................ | G02B 6/12002 |
| | | | | 385/11 |
| 2015/0346520 A1* | 12/2015 | Lee | ............... | G02F 1/011 |
| | | | | 385/2 |

OTHER PUBLICATIONS

Fedeli, J.M. et al., "Development of Silicon Photonics Devices Using Microelectronic Tools for the Integration on Top of a CMOS Wafer", Advances in Optical Technologies, 2008, 16 pages, vol. 2008, Article ID 412518, Hindawi Publishing Corporation.

Goykhman, I. et al., "Waveguide based compact silicon Schottky photodetector with enhanced responsivity in the telecom spectral band", Optics Express, Dec. 17, 2012, 9 pages, vol. 20, No. 27, Optical Society of America.

Guo, J. et al., "Schottky photodetector with tapered thin metal strip on silicon waveguide", International Conference on Optoelectronics and Microelectronics Technology and Application, 2017, pp. 1024420-1 through 1024420-5, vol. 10244, Proc. of SPIE.

International Search Report and Written Opinion of the International Searching Authority, dated Nov. 22, 2018, corresponding to PCT/IB2018/001068, 18 pages.

Muehlbrandt, S. et al., "Silicon-plasmonic internal-photoemission detector for 40 Gbit/s data reception", Optica, Jul. 2016, pp. 741-747, vol. 3, No. 7, Optical Society of America.

Sure, A. et al., "Fabrication and characterization of three-dimensional silicon tapers", Optics Express, Dec. 29, 2003, pp. 3555-3561, vol. 11, No. 26, Optical Society of America.

Yang, L. et al., "Proposal of a broadband, polarization-insensitive and high-efficiency hot-carrier schottky photodetector integrated with a plasmonic silicon ridge waveguide", Journal of Optics, Nov. 5, 2015, 11 pages, IOP Publishing Ltd.

U.K. Intellectual Property Office Examination Report, dated Jul. 29, 2021, for Patent Application No. GB 2004077.0, 2 pages.

Ayalew, T., "SiC Semiconductor Devices Technology, Modeling, and Simulation", Technischen Universität Wien, Fakultät für Elektrotechnik and Informationstechnik, Jan. 1, 2004, pp. 1-4, https://www.iue.tuwien.ac.at/phd/ayalew/node56.html.

European Patent Office Communication pursuant to Article 94(3) EPC, for Patent Application No. 18 778 551.4, dated Oct. 27, 2021, 7 pages.

U.K. Intellectual Property Office Examination Report, dated Nov. 25, 2021, for Patent Application No. GB2004077.0, 6 pages.

U.K. Intellectual Property Office Examination Report, dated Mar. 14, 2022, for Patent Application No. GB2004077.0, 5 pages.

* cited by examiner

SCHOTTKY PHOTODETECTOR

CROSS-REFERENCE TO RELATED APPLICATION(S)

This application is a national stage entry, under 35 U.S.C. § 371, of International Application Number PCT/IB2018/001068, filed on Aug. 20, 2018, which claims priority to and the benefit of U.S. Provisional Patent Application No. 62/548,751, filed Aug. 22, 2017. The entire contents of all of the applications identified in this paragraph are incorporated herein by reference.

FIELD

The present invention relates to optoelectronic devices, and particularly to Schottky photodetectors comprising a metal contact which substantially surrounds a silicon waveguide.

BACKGROUND

An important component in communication systems are 1310 nm and 1550 nm photodetectors i.e. photodetectors which operate at a wavelength of 1310 nm and 1350 nm. Additionally, detectors are required at other infra-red wavelengths. However, because of the bandgap which exists in silicon PN junctions, silicon PN photodetectors have no response at these wavelengths. Therefore, photodetectors operating at these wavelengths are usually made from germanium or InGaAs. However, to make such a photodetector on a silicon substrate, device structures other than PN junctions have to be used, one of which is a Schottky photodetector utilizing the internal photo-emission effect (IPE).

However, conventional Schottky photodetectors have extremely low responsivity, which deficiency can significantly impair the practical application of the device because very few photons are absorbed by the metal layer. Responsivity may be defined as how much photocurrent is generated by a unit optical power at a specific wavelength. This can be described as $$= \frac{Quantum efficiency \times \lambda}{1.24},$$

where λ is the wavelength in units of micrometres.

In order to increase the silicon Schottky photodetector's responsivity, more photons have to be absorbed by the metal layer. Recently, methods to increase silicon waveguide based Schottky photodetector's responsivity have been reported as in references 1-5:

In ref. 1, the waveguide is a strip silicon waveguide and the metal only contacts the top of the waveguide. In this structure, the optical mode mismatch between the silicon waveguide and the waveguide with metal on top is large, with only a 62% coupling efficiency, therefore the responsivity is low, at only 12.5 mA/W with internal quantum efficiency of 1%.

In ref. 2, a rib silicon waveguide is used with a metal contact on top of the waveguide and part of the waveguide sidewalls. An SU8 photoresist is used as cladding layer which will have potential reliability issues, and the electrode for the Schottky contact is made of gold, which will be a potential contamination source for other silicon devices. Therefore this structure is not suitable for dense silicon photonics integrated circuits applications.

In ref 3, the waveguide is a strip waveguide and a tapered gold electrode is on top of the silicon waveguide to make the Schottky contact. This has the same drawback in ref 2 about gold contamination.

In ref 4, the silicon waveguide has a trapezoidal shape tapered from 400 nm to 200 nm and then down to 75 nm, which is difficult to fabricate. Two types of metals (Au and Ti) are used as the electrode to make the Schottky contact. Gold on one side of the waveguide and Ti on the other side to form a metal-semiconductor-metal (MSM) junction. This device also has the same drawback in ref 2 about gold contamination.

In ref 5, both signal and ground electrodes are located on top of the waveguide, which is formed by a thin strip of material having a relatively high free change carrier density. This waveguide cannot be used in silicon photonics integrated circuits.

In some embodiments of this invention, not only does the silicon Schottky photodetector have high responsivity, but also does not need a photoresist or gold electrode. It can also be provided with a simple fabrication process. Therefore reliability and contamination issues may be less significant in, or entirely absent from, this silicon Schottky photodetector.

SUMMARY

Accordingly, in a first aspect, some embodiments of the invention provide an optoelectronic device comprising: a rib waveguide formed of doped silicon, having: a ridge portion, containing an uppermost surface and two sidewall surfaces; and a slab portion, adjacent to the two sidewall surfaces; the device further comprising: a metal contact layer, which directly abuts the uppermost surface and two sidewall surfaces, and which extends along a part of the slab portion so as to provide a Schottky barrier between the metal contact layer and the rib waveguide.

The doped silicon may be p-type doped and may, for example, have a resistivity of between 5 Ωcm 10 Ωcm inclusive. The dopant may be boron. The Schottky barrier may have a barrier energy of between 0.22 eV and 0.8 eV inclusive, which depends on the type of metal used for the metal contact layer, silicon doping concentration, silicon surface-state density, and the temperature. The optoelectronic device may be a photodetector, and more particularly a Schottky photodetector.

The device may further comprise a heavily doped region disposed within the slab portion. The dopant may be boron. Providing a heavily doped region can reduce the electrical resistance of the device. The heavily doped region may be disposed within the slab portion at a distance of between 1 μm and 5 μm inclusive from the ridge portion.

The device may further comprise an electrode disposed in electrical connection with the heavily doped region.

The metal contact layer may be made of a metal which is not gold. If the device does not comprise gold, there may be a reduction in the risk of contamination of other photonic devices which may be located near to the optoelectronic device.

The metal contact layer may be made of titanium, tungsten, or platinum. The use of titanium, tungsten, or platinum increases the operational bandwidth of the device due to the different barrier heights provided by these materials. For example, a titanium based Schottky barrier has a height of between 0.7 and 0.8 eV inclusive, which corresponds to a cut-off wavelength of between 1.55 μm and 1.77 μm inclusive. A tungsten based Schottky barrier has a height of around 0.56 eV, which corresponds to a cut-off wavelength of around 2.2 μm, and a platinum based Schottky barrier has a height of around 0.22 eV which corresponds to a cut-off wavelength of around 5.6 μm.

The ridge portion may have a width as measured from one sidewall to the other of between 400 nm and 600 nm inclusive, and in some embodiments has a width of 500 nm.

The ridge portion may have a height as measured from an uppermost surface of the slab portion of between 100 nm and 150 nm inclusive, and in some embodiments has a height of 120 nm for a 220 nm thick SOI. In some embodiments the ridge portion may have a height of 1.3 μm for a 1.5 μm thick SOI. In some embodiments the ridge portion may have a height of 1.6 μm for a 1.8 μm thick SOI. In some embodiments the ridge portion may have a height of 2.8 μm a for 3 μm thick SOI.

The metal contact layer may be between 20 nm thick and 200 nm thick inclusive. That is, the metal contact may have a dimension in a direction perpendicular to the guiding direction of the waveguide which is between 20 nm and 200 nm inclusive.

The device may further comprise a layer of titanium nitride disposed on top of the metal contact layer. In such examples, the metal contact layer may be formed of titanium. The layer may act to limit the oxidation of the metal contact layer. The titanium nitride layer may be between 10 nm thick and 100 nm thick inclusive.

The metal contact layer may extend along the waveguide, in a direction parallel to a guiding direction of the waveguide, for a distance of between 1 μm and 20 μm inclusive.

The device may further comprise an electrode disposed in electrical connection with the metal contact layer.

The rib waveguide may be a tapered rib waveguide, and may have a width as measured from one sidewall to the other which tapers from 500 nm to 300 nm in a direction parallel to a guiding direction of the waveguide.

The device may further comprise an input waveguide, coupled to the rib waveguide. The input waveguide may have a height as measured from an uppermost surface of an insulator to an uppermost surface of the input waveguide, of at least 1.5 μm and no more than 3 μm.

The input waveguide may taper from a first height to a second height, the second height being less than the first height and the second height being proximal to the rib waveguide.

The input waveguide may taper by one or more discrete steps in height. For example, the input waveguide may taper in some examples by two discrete steps in height By discrete, it may be meant that there is a step change in the height which is not considered continuous.

Herein, uppermost may refer to a position or direction which is distal to a substrate of the device.

The metal contact layer together with the rib waveguide may form a plasmonic waveguide. Such a plasmonic waveguide may have a high optical absorption, which can increase the efficiency of the photodetector. Moreover, a small mismatch may be engineered between the rib waveguide and the metal plasmonic waveguide, such that >92% coupling efficiency may be obtained between the rib waveguide and the metal plasmonic waveguide.

In a second aspect, some embodiments of the invention provide a method of fabricating an optoelectronic device, comprising the steps of: disposing a mask over a portion of a doped silicon-on-insulator layer; etching unmasked portions of the silicon-on-insulator layer, to provide a rib waveguide comprising: a ridge portion, containing an uppermost surface and two sidewall surfaces; and a slab portion, adjacent to the two sidewall surfaces; disposing a metal contact layer so as to directly abut the uppermost surface and the two sidewall surfaces of the ridge portion and a part of the slab portion; and annealing the device, to form a Schottky barrier between the metal contact layer and the rib waveguide.

The method may further comprise a step of heavily implanting a region of the slab portion with dopants of a first species.

After the step of implanting, the method may further comprise a step of: annealing the device. After the annealing step, the method may further comprise a step of: disposing an upper cladding layer over the device; and patterning the upper cladding layer before disposing the metal contact layer.

The method may further comprise a step of: disposing a first electrode in electrical contact with the region of the slab implanted with dopants and a second electrode in electrical contact with the metal contact layer.

The method may further comprise a step depositing a second metal contact layer over the metal contact layer. The second metal contact layer may be formed of titanium nitride, and the metal contact layer may be formed of titanium.

The method may further comprise a step of forming an input waveguide, coupled to the rib waveguide, wherein said input waveguide has a height as measured from an uppermost surface of an insulator layer, of between 1 μm and 3 μm inclusive. The input waveguide may be formed so as to taper from a first height to a second height, the second height being less than the first height and the second height being proximal to the rib waveguide. The input waveguide may be formed so as to taper by one, two or more discrete steps in height.

BRIEF DESCRIPTION OF THE DRAWINGS

Embodiments of the invention will now be described by way of example with reference to the accompanying drawings in which.

DETAILED DESCRIPTION AND FURTHER OPTIONAL FEATURES

Figure 1:
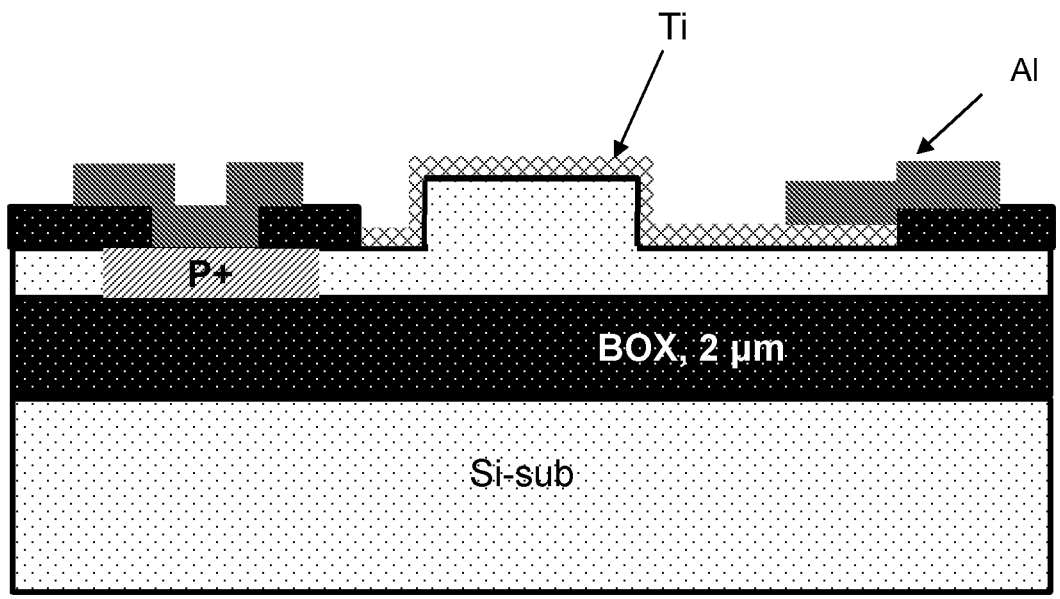
FIG. 1 shows an optoelectronic device according to some embodiments of the invention.
Figure 2:
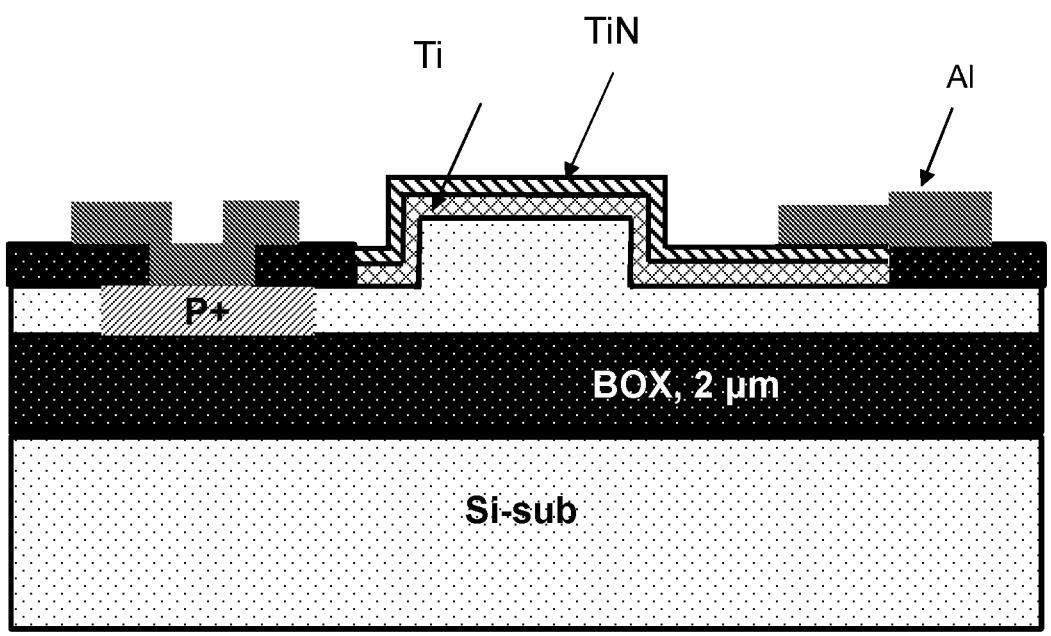
FIG. 2 shows a variant optoelectronic device according to some embodiments of the invention.

FIG. 1 shows an optoelectronic device according to some embodiments of the present invention. Broadly it comprises, on a 220 nm silicon on insulator (SOI) with 2 μm BOX layer and p-type dopant (resistivity 5-10 Ωcm), a rib waveguide with a width of 500 nm and a rib depth of 120 nm. The silicon waveguide can be a straight waveguide, or a tapered waveguide from 500 nm to 300 nm. A heavy p-type doped region (P+) is formed close to the rib waveguide (1-5 µm) to provide low contact resistance for the electrode. A layer of Ti (20 nm-200 nm) with or without a layer of TiN (10-100 nm) is placed directly on top of the silicon rib waveguide (i.e. the uppermost surface of the rib waveguide), both side walls of the silicon rib waveguide and adjacent slab (1-3 µm) of the silicon rib waveguide is deposited to make a Schottky contact (diode). A layer of TiN on top of the Ti layer may be used to protect the Ti layer from oxidation. The length of the Ti (or Ti/TiN) is typically 1 to 20 µm. Aluminium electrodes are then made to contact the P+ doped region and the Ti (or Ti/TiN) layer. These devices are shown in FIG. 1 and FIG. 2 (where FIG. 2 shows an example including the TiN layer).

FIGS. 3a-3i illustrate various stages of manufacturing the optoelectronic device described above. In a first step, shown in FIG. 3a, a silicon-on-insulator (soi) wafer is provided. Notably the silicon-on-insulator layer, disposed above the buried oxide layer, is doped with p-type dopants to provide an electrical resistivity of between 5 and 10 Ωcm. The silicon-on-insulator layer is approximately 220 nm thick, i.e as measured from an upper surface of the silicon layer to an upper surface of the buried oxide layer.

Figure 3A:
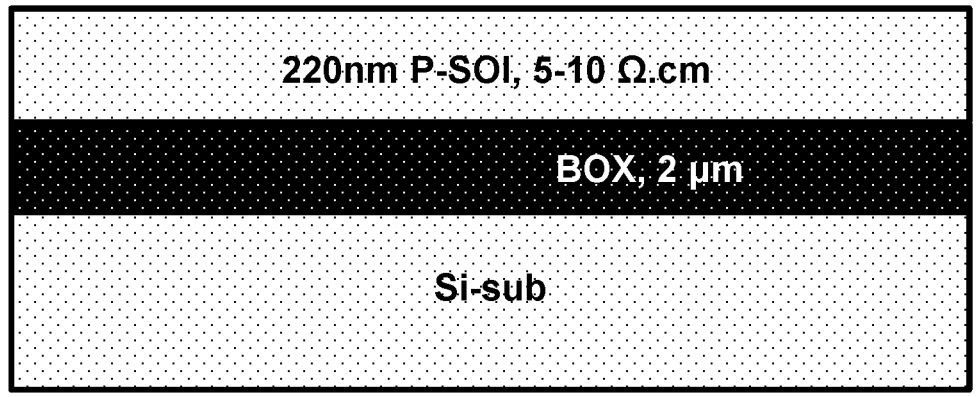
FIG. 3a-3i show various manufacturing steps for an optoelectronic device according to some embodiments of the invention.
Figure 3B:
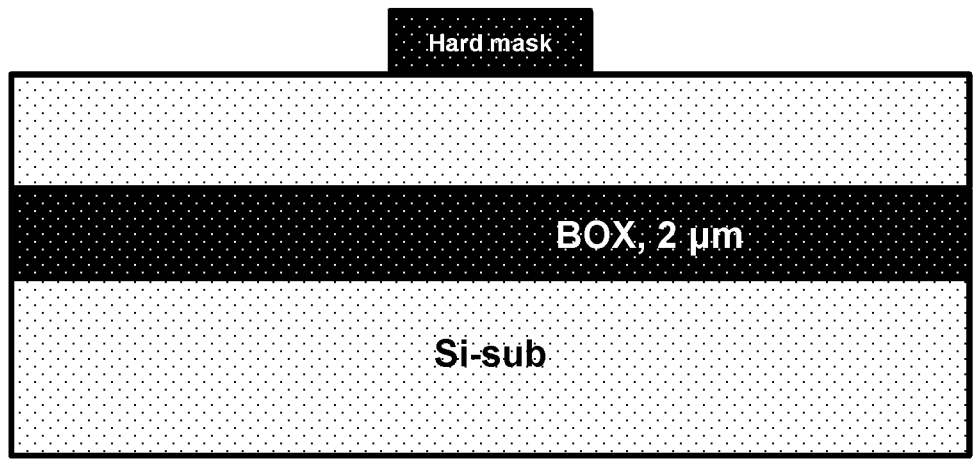
Figure 3C:
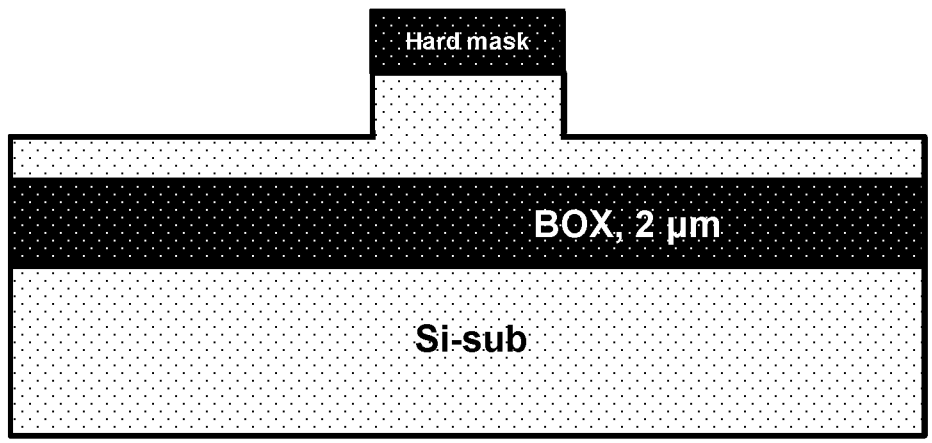
Figure 3D:
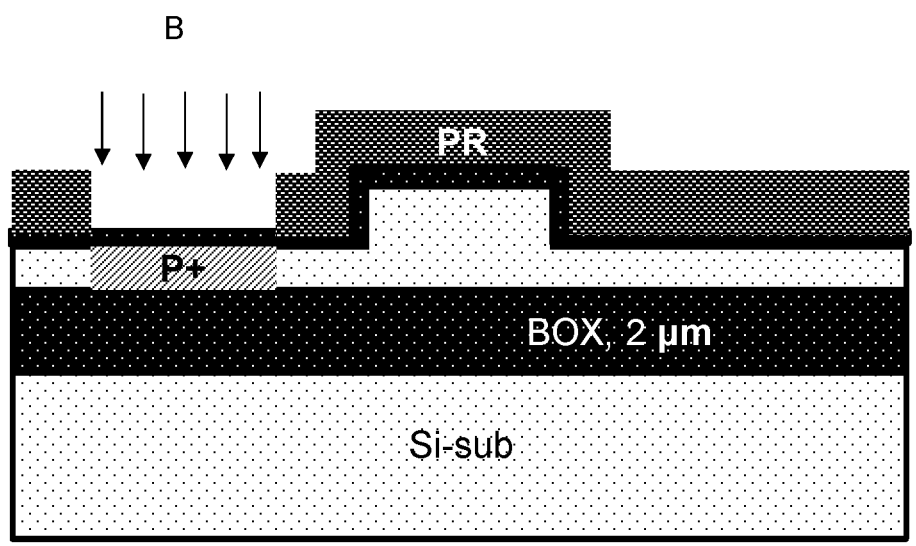

In a second step shown in FIG. 3b, a hard mask is disposed over a portion of the silicon-on-insulator layer. Subsequently, as shown in FIG. 3c, the unmasked portions of the doped silicon-on-insulator layer are partially etched. This results in a rib waveguide formed from the doped silicon layer, which comprises a ridge portion (i.e. the portion underneath the hard mask) and a slab portion (i.e. the region either side of the ridge portion). The ridge portion can be described as containing an uppermost surface and two sidewall surfaces. The uppermost surface being the surface most distal from the buried oxide layer and the side walls surfaces being adjacent thereto.

The hard mask is then removed, and a photoresist is disposed over a region of the upper most surface leaving a window used for providing a heavily doped region by implantation. In an optional, step a silicon dioxide layer may be provided between the photoresist and the silicon-on-insulator layer for surface protection. The heavily doped region (which may be P+ doped using boron as a dopant) may be used to reduce the electrical resistivity of the device.

Figure 3E:
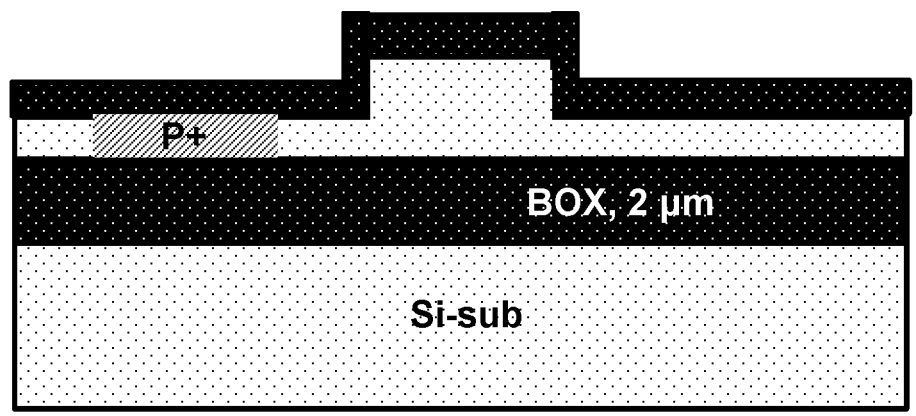
Figure 3F:
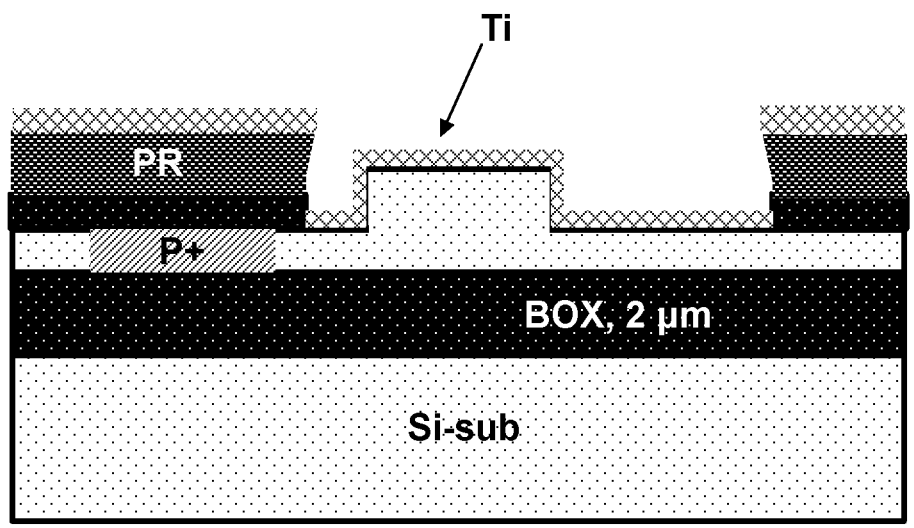

Next, as shown in FIG. 3e, the device may be annealed and an upper cladding layer may be deposited over the device. Then, as shown in FIG. 3f a further photoresist may be provided over a region of the upper cladding layer, the uncovered areas of the upper cladding layer may be etched away, and a metal contact may be patterned and deposited over the device. The metal contact may be formed from a metal including any one of: titanium, platinum, or tungsten. The metal contact may be formed of a metal which is not gold. Where the metal contact is formed of titanium, an optional titanium nitride layer may be provided over the metal contact titanium layer and used to protect the metal contact layer from oxidation.

Figure 3G:
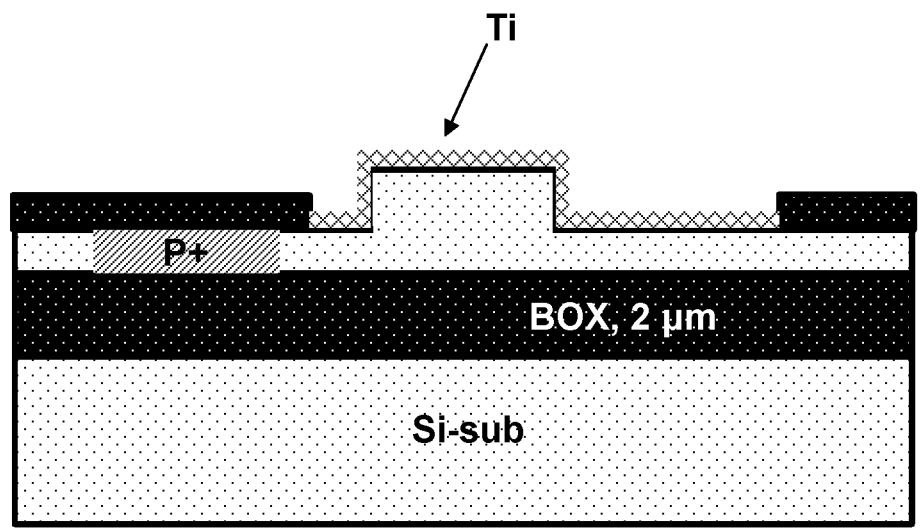

The photoresist can then be removed, as shown in FIG. 3g, resulting in a device with a metal contact layer disposed over a portion of the ridge and the slab of the rib waveguide. The device is then annealed, which can form a Schottky barrier between the metal contact layer and the silicon-on-insulator layer (which is P doped).

Figure 3H:
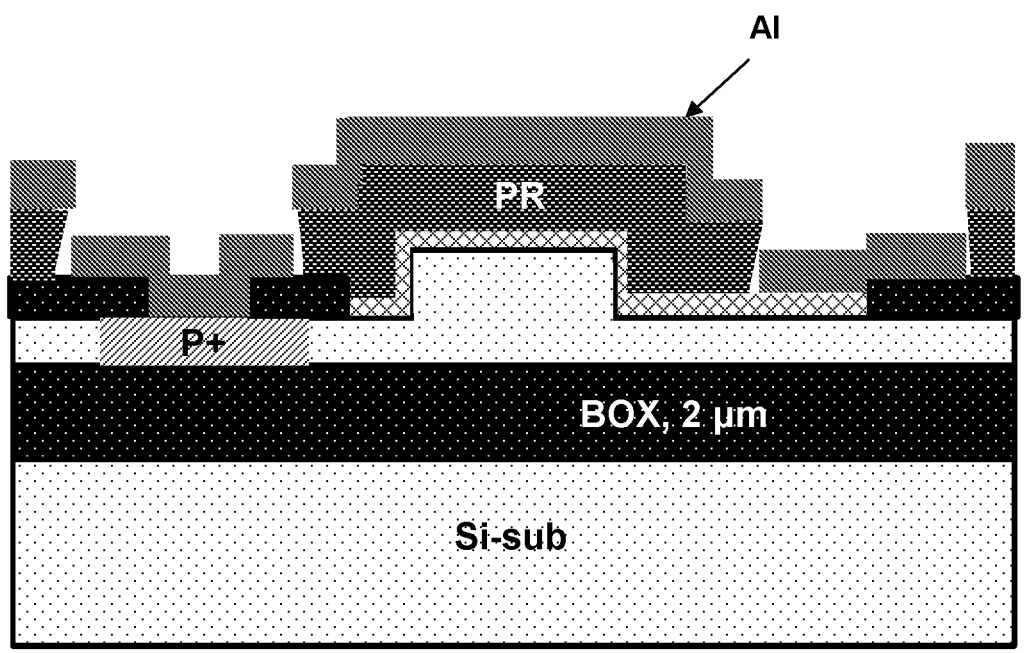
Figure 3I:
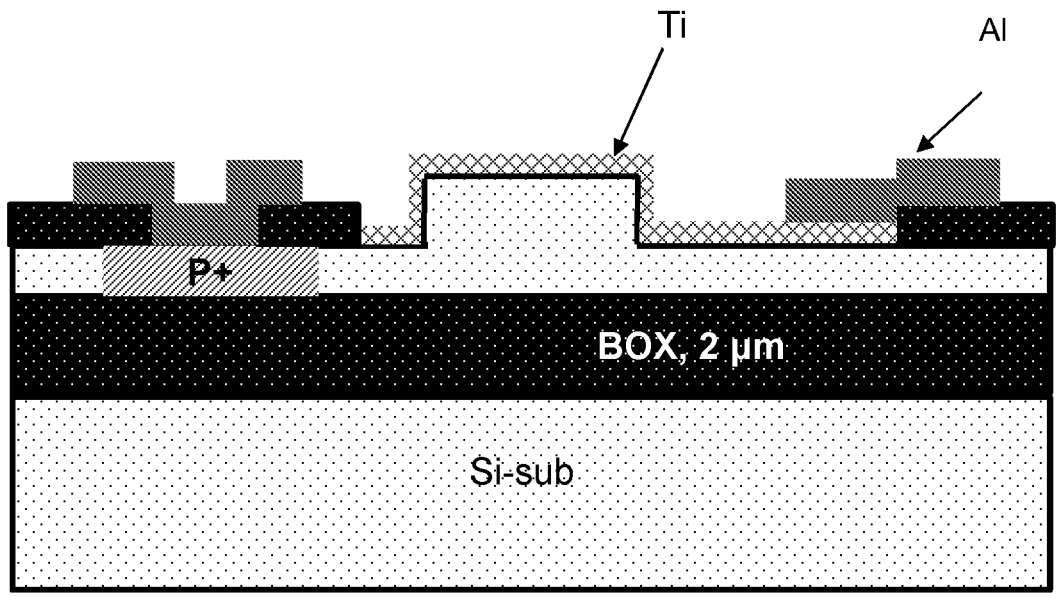

In a further step, electrodes (which may be formed of aluminium) are patterned and deposited over the device so as to form first and second electrodes which respectively connect to the heavily doped region and the metal contact layer. This is shown in FIG. 3h. In a further step, the photoresist used in providing the electrodes, and any excess electrode material, is removed and the device is annealed as shown in FIG. 3i.

Figure 4:
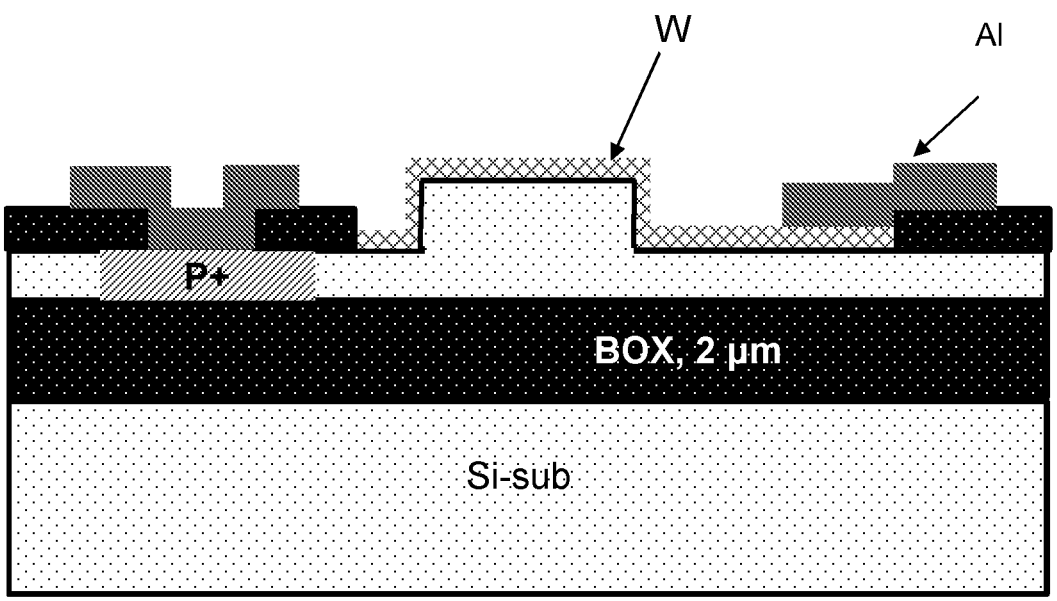
FIGS. 4 and 5 respectively show variant optoelectronic devices according to some embodiments of the present invention.
Figure 5:
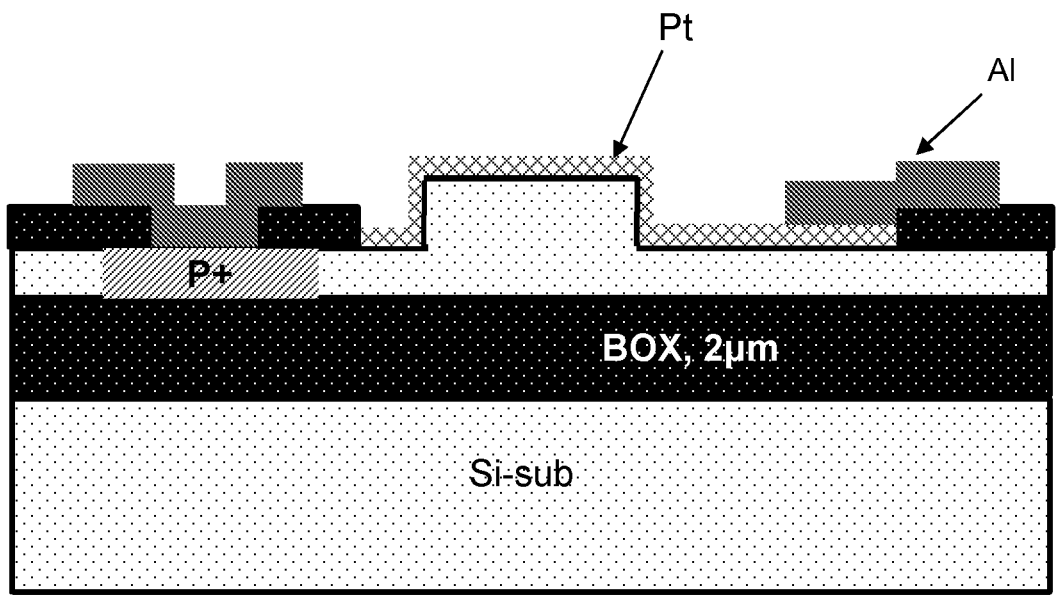

FIGS. 4 and 5 show further variants of the optoelectronic device. These are generally identical to the device shown in FIG. 1, however in FIG. 4 the metal contact layer is formed of tungsten (N) and in FIG. 5 the metal contact layer is formed of platinum (Pt).

Figure 6:
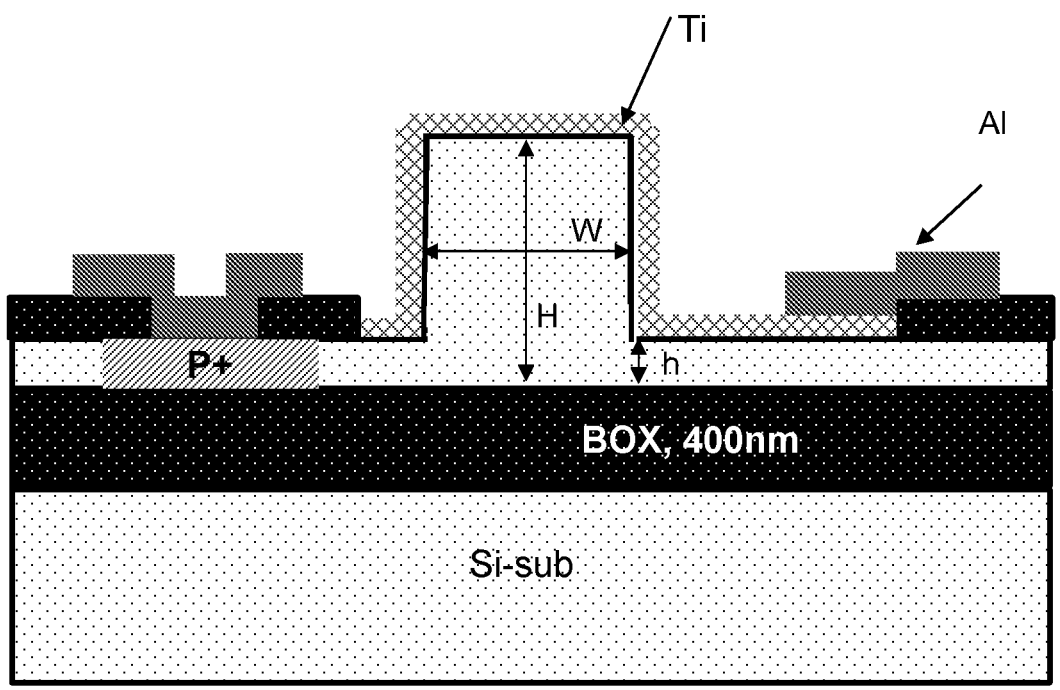
FIGS. 6 and 7 respectively show variant optoelectronic devices implementable in 1 μm, 1.5 μm, 1.8 μm or 3 μm SOI platforms according to some embodiments of the present invention.

FIG. 6 shows a variant of the optoelectronic device. This device is based on a thicker SOI with a BOX layer having a height, as measured from an uppermost surface of the substrate to an uppermost surface of the BOX layer, of 400 nm. The SOI thickness, H, can be 1 µm, or, 1.5 µm, or 1.8 µm, or 3 µm; the slab thickness h is 200 nm; and the rib waveguide width W can be between 400 nm and 600 nm. The metal contact layer is formed of Ti. The metal contact layer can also be formed of Pt or W depending, for example, on the wavelength response requirements.

Figure 7:
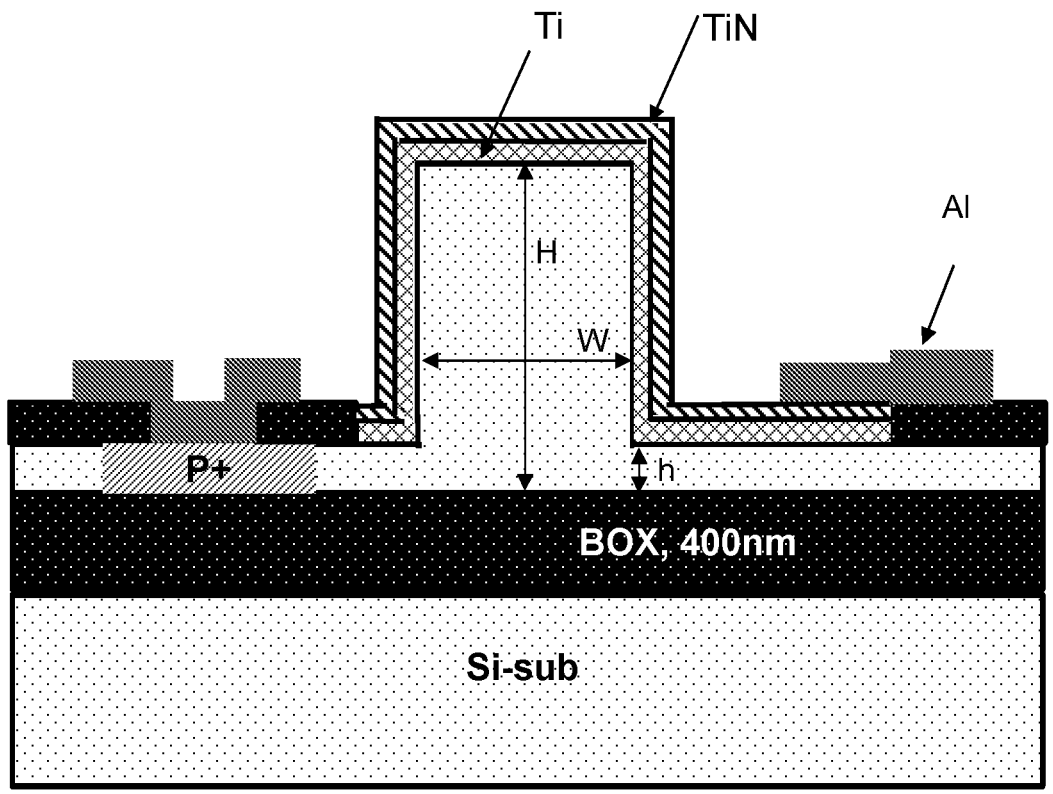

FIG. 7 shows a variant of the optoelectronic device. This device has the same device structure as that in FIG. 6, with the exception that an additional layer of TiN on top of the Ti metal layer is present.

Figure 8A:
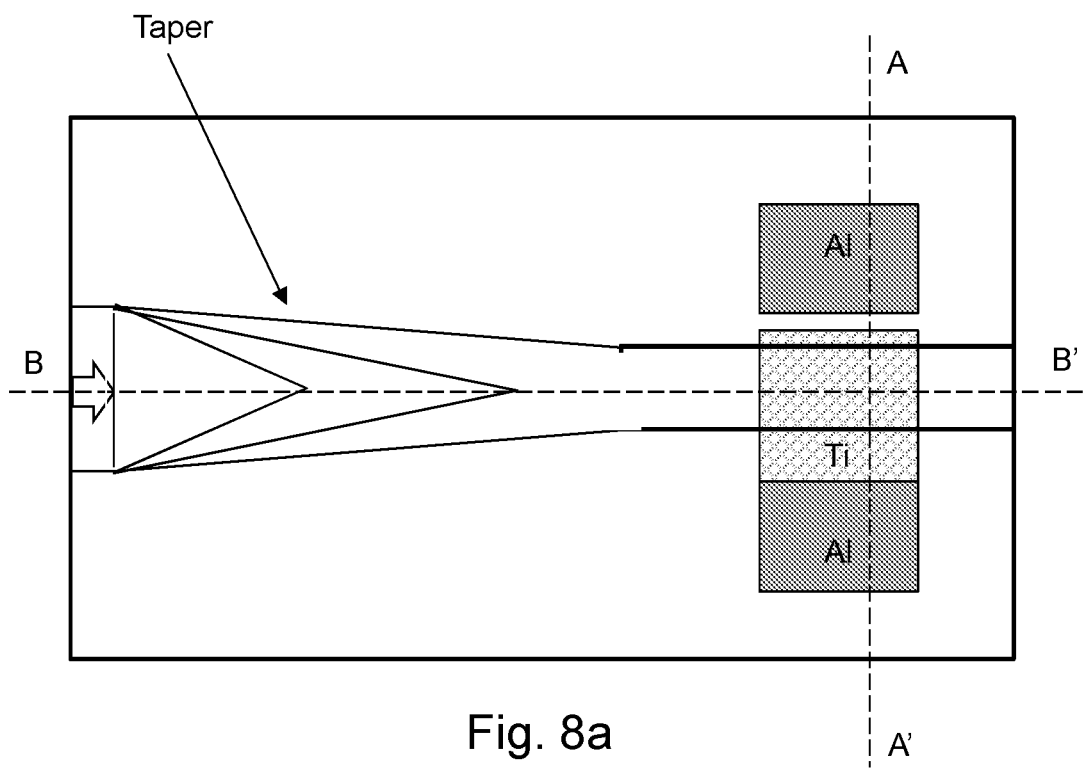
FIGS. 8a, 8b and 8c show different views of a variant optoelectronic device with a taper structure according to some embodiments of the present invention.
Figure 8B:
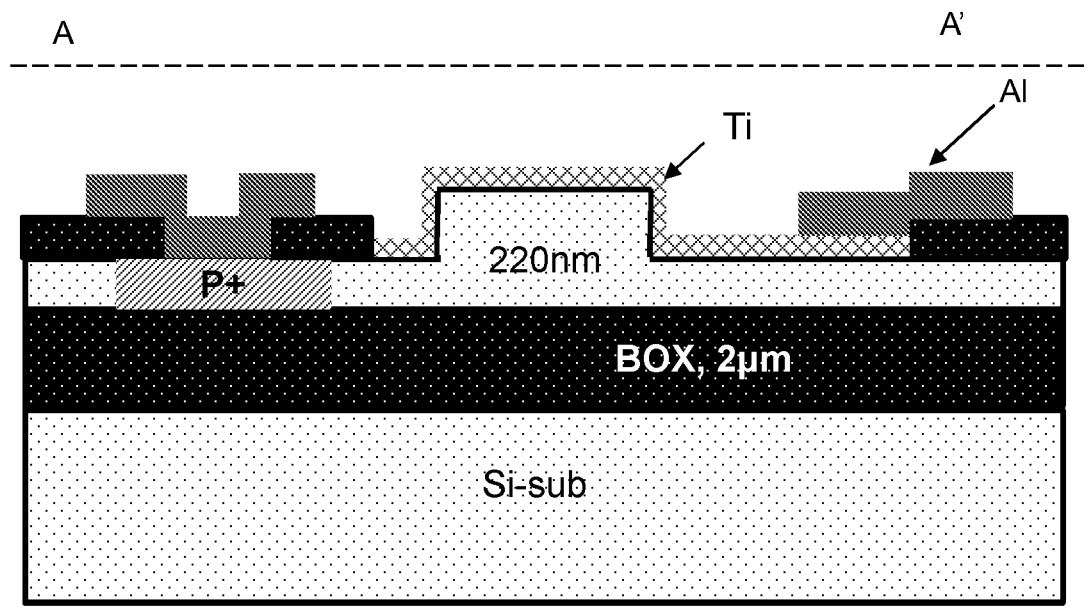
Figure 8C:
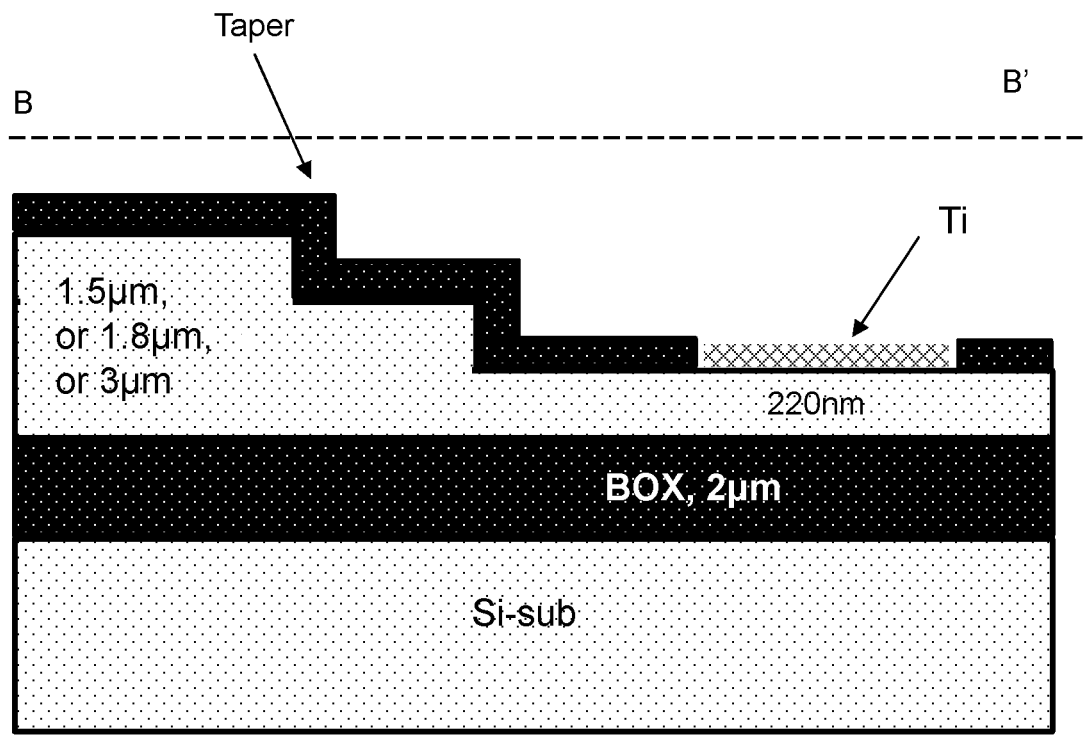

FIG. 8a shows the top view of a variant of the optoelectronic device. This device is based on a thicker SOI with a BOX layer of 2 µm. The input waveguide (the left side indicated with an arrow) has an SOI thickness of either 1 µm, or 1.5 µm, or 1.8 µm, or 3 µm, and the Schottky junction is formed in the right side with an SOI thickness of 220 nm. The input waveguide width can be between 1 µm and 2.6 µm, and the waveguide width of the Schottky junction is between 400 nm and 600 nm. There is a taper waveguide formed between the thicker input waveguide and the 220 nm waveguide which minimizes the transition optical loss. The taper structure can have one step in height or multiple steps in height. In FIG. 8a, the taper structure has two steps in height as an example. The length of each step along the light propagation direction can be between 500 µm and 5000 µm, and the tip width of the taper (as measured perpendicularly to the guiding direction) can be between 100 nm and 500 nm. FIG. 8b shows the section view along the line AA' in FIG. 8a, which shows the Schottky junction with Ti metal layer. FIG. 8c shows the section view along the line BB' in FIG. 8a, which shows the taper waveguide structure with two height steps.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

REFERENCES

1. Ilya Goykhman, et al., Optics Express, Vol. 20, No. 27, p28594
2. Liu Yang, et al., Journal of Optics, Vol. 17, 2015 p125010
3. Jingshu Guo, et al., Proc. Of SPIE Vol. 10244, 2017, p1024420
4. S. Muehlbrandt, et al., Optica, Vol. 2, No. 7, 2016, p741
5. U.S. Pat. No. 7,026,701B2

All references referred to above are hereby incorporated by reference.

The invention claimed is:

1. An optoelectronic device comprising:
a rib waveguide formed of doped silicon, having:
a ridge portion formed of doped silicon and containing an uppermost surface and two sidewall surfaces; and
a slab portion, adjacent to the two sidewall surfaces;
the device further comprising:
a metal contact layer, which directly abuts the uppermost surface and two sidewall surfaces, which directly contacts at least a portion of the slab portion, and which extends along a part of the slab portion so as to provide a Schottky barrier between the metal contact layer and the rib waveguide.

2. The optoelectronic device of claim 1, wherein the metal contact layer is titanium having a thickness from 20 nm to 200 nm inclusive.

3. The optoelectronic device of claim 1, wherein the metal contact layer comprising titanium and titanium nitride, a titanium layer of the metal contact layer has a thickness from 20 nm to 200 nm, and a titanium nitride layer of the metal contact layer has a thickness from 10 nm to 100 nm inclusive.

4. The optoelectronic device of claim 1, wherein the metal contact layer is tungsten having a thickness from 20 nm to 200 nm inclusive.

5. The optoelectronic device of claim 1, wherein the metal contact layer is platinum having a thickness from 20 nm to 200 nm inclusive.

6. The optoelectronic device of claim 1, wherein the rib waveguide length is between 1 µm to 20 µm inclusive.

7. The optoelectronic device of claim 1, wherein a heavily P-doped region is within the slab portion.

8. The optoelectronic device of claim 7, wherein the heavily P-doped region is located 1 µm to 5 µm inclusive away from a sidewall surface of the two sidewall surfaces.

9. The optoelectronic device of claim 1, wherein the rib waveguide is a straight waveguide with a width of 500 nm.

10. The optoelectronic device of claim 1, wherein the rib waveguide is a tapered waveguide which tapers from 500 nm to 300 nm.

11. The optoelectronic device of claim 1, further comprising an input waveguide, coupled to the rib waveguide, wherein said input waveguide has a height as measured from an uppermost surface of an insulator layer to an uppermost surface of the input waveguide, of between 1 µm and 3 µm inclusive.

12. The optoelectronic device of claim 11, wherein the input waveguide tapers from a first height to a second height, the second height being less than the first height and the second height being proximal to the rib waveguide.

13. The optoelectronic device of claim 12, wherein the input waveguide tapers by one or more discrete steps in height.

14. A method of fabricating an optoelectronic device, comprising the steps of:
disposing a mask over a portion of a doped silicon-on-insulator layer;
etching unmasked portions of the silicon-on-insulator layer, to provide a rib waveguide comprising:
a ridge portion formed of doped silicon and containing an uppermost surface and two sidewall surfaces; and
a slab portion, adjacent to the two sidewall surfaces;
disposing a metal contact layer so as to directly abut the uppermost surface and the two sidewall surfaces of the ridge portion, the metal contact layer directly contacting at least a portion of the slab portion; and
annealing the device, to form a Schottky barrier between the metal contact layer and the rib waveguide.

15. The method of claim 14, further comprising a step, before disposing the metal contact layer, of heavily implanting a region of the slab portion with dopants of a first species.

16. The method of claim 15, further comprising a step, after the implantation and before disposing the metal contact layer, of performing a dopant-annealing step on the device.

17. The method of claim 16, further comprising a step, after the dopant-annealing step, of disposing an upper cladding layer over the device, and patterning the upper cladding layer before disposing the metal contact layer.

18. The method of claim 15, further comprising a step of disposing a first electrode in electrical contact with the region of the slab portion implanted with dopants and a second electrode in electrical contact with the metal contact layer.

19. The method of claim 14, wherein the metal contact layer is formed of titanium.

20. The method of claim 14, further comprising a step of depositing a second metal contact layer over the metal contact layer.

21. The method of claim 20, wherein the second metal contact layer is formed of titanium nitride.

22. The method of claim 14, further comprising a step of forming an input waveguide, coupled to the rib waveguide, wherein said input waveguide has a height as measured from an uppermost surface of an insulator layer, of between 1 µm and 3 µm inclusive.

23. The method of claim 22, wherein the input waveguide is formed so as to taper from a first height to a second height, the second height being less than the first height and the second height being proximal to the rib waveguide.

24. The method of claim 23, wherein the input waveguide is formed so as to taper by one or more discrete steps in height.

* * * * *